United States Patent
Sunohara et al.

(10) Patent No.: US 8,141,770 B2
(45) Date of Patent: Mar. 27, 2012

(54) CONDUCTIVE BALL MOUNTING METHOD AND SURPLUS BALL REMOVING APPARATUS

(75) Inventors: Fumio Sunohara, Nagano (JP); Kiyoaki Iida, Nagano (JP); Masakazu Kobayashi, Nagano (JP); Kesami Maruyama, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 22 days.

(21) Appl. No.: 12/333,619

(22) Filed: Dec. 12, 2008

(65) Prior Publication Data

US 2009/0159651 A1 Jun. 25, 2009

(30) Foreign Application Priority Data

Dec. 19, 2007 (JP) ................... 2007-327206

(51) Int. Cl.
 *B23K 35/12* (2006.01)
 *B23K 3/06* (2006.01)
(52) U.S. Cl. .......................... 228/246; 228/41
(58) Field of Classification Search .................. 228/246, 228/41, 180.22, 245, 248.1; 219/85.19, 85.2, 219/85.21; 438/613
 See application file for complete search history.

(56) References Cited

U.S. PATENT DOCUMENTS

| | | | | |
|---|---|---|---|---|
| 5,695,667 A * | 12/1997 | Eguchi et al. | ............ | 219/388 |
| 6,402,014 B1 * | 6/2002 | Inoue et al. | ............ | 228/245 |
| 6,541,364 B2 * | 4/2003 | Mukuno et al. | ............ | 438/612 |
| 6,564,991 B1 * | 5/2003 | Kinoshita | ............ | 228/245 |
| 6,869,008 B2 * | 3/2005 | Inoue et al. | ............ | 228/189 |
| 2001/0011828 A1 * | 8/2001 | Ujita et al. | ............ | 294/64.1 |
| 2004/0003891 A1 * | 1/2004 | Cheng et al. | ............ | 156/297 |
| 2006/0086777 A1 * | 4/2006 | Itoh et al. | ............ | 228/253 |

FOREIGN PATENT DOCUMENTS

| | | |
|---|---|---|
| JP | 09036179 * | 2/1997 |
| JP | 2000-228456 | 8/2000 |
| JP | 2001-358450 A1 | 12/2001 |
| JP | 2002-056901 | 2/2002 |
| JP | 2002-184803 A1 | 6/2002 |
| JP | 2003-309139 | 10/2003 |
| JP | 2005-166908 | 6/2005 |
| JP | 2006-173195 A1 | 6/2006 |

OTHER PUBLICATIONS

European Search Report dated Sep. 23, 2011, issued for counterpart European Patent Application No. 08170698.8.
Japanese Office Action issued for counterpart Japanese Patent Application No. 2007-327206 dated Dec. 13, 2011.

* cited by examiner

*Primary Examiner* — Roy King
*Assistant Examiner* — Michael Aboagye
(74) *Attorney, Agent, or Firm* — Kratz, Quintos & Hanson, LLP

(57) ABSTRACT

A surplus ball removing apparatus including a substrate stage, a substrate including a connection pad, a mask with opening to supply conductive ball onto the substrate, a surplus ball adhering head for removing surplus ball mounted on the substrate, adhering head moving system, an image processing portion, an adhesive material stage, and a ball recovering stage.

3 Claims, 16 Drawing Sheets

US 8,141,770 B2

CONDUCTIVE BALL MOUNTING METHOD AND SURPLUS BALL REMOVING APPARATUS

CROSS-REFERENCE TO RELATED APPLICATIONS

This application is based on and claims priority of Japanese Patent Application No. 2007-327206 filed on Dec. 19, 2007, the entire contents of which are incorporated herein by reference.

BACKGROUND OF THE INVENTION

1. Field of the Invention

The present invention relates to a conductive ball mounting method and a surplus ball removing apparatus and, more particularly, a conductive ball mounting method for forming bump electrodes by mounting conductive balls on a wiring substrate, or the like and a surplus ball removing apparatus used in this method.

2. Description of the Related Art

In the prior art, there is the method of forming the bump electrodes by mounting the solder ball on the connection pads of the wiring substrate on which the semiconductor chip, or the like is mounted, respectively. In such solder ball mounting method, as shown in FIG. 1, first, a wiring substrate 100 on which the solder balls are to be mounted is prepared. In the wiring substrate 100, connection pads 200 which are connected to buildup wirings (not shown) is provided on an upper surface side of a substrate 110, and a solder resist 300 in which opening portions 300a are provided on the connection pads 200 is formed. Also, a flux 400 is coated on the connection pads 200 respectively.

Then, as shown in FIG. 2, a mask 500 used to mount the solder balls is arranged on the wiring substrate 100. A plurality of opening portions 500a through which the solder ball is passed respectively are provided in portions which correspond to the connection pads 200 of the wiring substrate 100, in the mask 500.

Then, as also shown in FIG. 2, a large number of solder balls 600 are supplied onto the mask 500, and the solder balls 600 are moved by a brush 700 such that these balls are swept out toward one end side of the mask 500. Thus, as shown in FIG. 3, the solder balls 600 are passed through the opening portions 500a of the mask 500, and then adhered to the fluxes 400 on the connection pads 200 of the wiring substrate 100 and placed thereon. Also, the extra solder balls 600 are swept out toward one end side of the mask. Then, the wiring substrate 100 is moved downward and is separated from the mask 500.

As the technology related to the above solder ball mounting method, in Patent Literature 1 (Patent Application Publication (KOKAI) 2001-358450), it is set forth that, a chip is set to the solder ball mounting apparatus equipped with the ball alignment mask, then the solder balls are put down through the through holes in the ball alignment mask by jolting the apparatus main body with the hand, and then the extra solder balls are recovered in the ball storage groove which is provided on the ball guide frame.

Also, in Patent Literature 2 (Patent Application Publication (KOKAI) 2006-173195), it is set forth that, a large number of solder balls are supplied onto the mask which is put on the wafer, then the solder balls are moved by the filling head with the sweeping member such that the solder ball is arranged in the opening portions of the mask respectively, and then the solder balls still remaining on the mask are swept outward the mask by the removing head having the soft squeegee and are removed from the mask.

Also, in Patent Literature 3 (Patent Application Publication (KOKAI) 2002-184803), it is set forth that, in the absorbing arrangement method in which a plurality of conductive balls are absorbed by the absorbing head, and the conductive balls are arranged collectively on respective electrodes, the normal conductive balls are supplemented in the ball unfilled locations on the electrodes, and in the ball surplus locations, an arrangement defect is removed and then the normal conductive balls are supplemented there.

In the above steps in FIG. 2 and FIG. 3 in the prior art, even though a large number of solder balls 600 on the mask 500 are moved toward one end side of the mask 500 by the brush 700, in many cases the extra solder balls 600 remain somewhat in the area where the opening portions 500a are arranged on the mask 500.

Therefore, as shown in FIG. 4, while the wiring substrate 100 is moved downward and is separated from the mask 500, in some cases the solder balls 600 still remaining on the mask 500 drop onto the wiring substrate 100 through the opening portions 500a of the mask 500. Further, because the mask 500 is jolted, sometimes the solder balls 600 which are swept out toward one end side of the mask 500 roll along in the opening portion 500a side of the mask 500, and then drop onto the wiring substrate 100.

When the extra solder balls 600 on the mask 500 drop onto the wiring substrate 100, the extra solder ball 600 (indicated with a black mark) is mounted in vicinity of the normal solder balls 600 which are arranged on the connection pads 200 on the wiring substrate 100. Therefore, in a situation that the bump electrodes are formed by melting the solder balls, extra-large bump electrodes which protrude higher than other bump electrodes are formed on the connection pads on which the extra solder ball 600 is mounted respectively, which acts as a cause of a reduction of yield of the wiring substrate.

There is the method of removing the surplus balls on the wiring substrate by human work, but this method needs the very troublesome work. As a result, the method capable of removing effectively the surplus balls is desired earnestly.

SUMMARY OF THE INVENTION

It is an object of the present invention to provide a conductive ball mounting method and a surplus ball removing apparatus used in this method, capable of removing effectively surplus balls which are to be mounted on a substrate and also mounting one conductive ball on each connection pad with good reliability, in the method of mounting a conductive ball on connection pads of the substrate via a mask.

The present invention is concerned with a conductive ball mounting method, which includes a step of, arranging a mask in which an opening portion is provided, on a substrate including a connection pad, arranging a conductive ball on the connection pad through the opening portion of the mask by supplying the conductive ball onto the mask, separating the substrate and the mask, in the step, an extra conductive ball left on the mask drops through the opening portion of the mask, thereby a surplus ball is mounted on the substrate, and removing the surplus ball on the substrate by making the surplus ball adhere onto an adhering head.

In the conductive ball mounting method of the present invention, the normal conductive balls are arranged on the connection pads of the substrate (the wiring substrate, or the like) through the opening portions of the mask, and the surplus balls which drop on the substrate when the wiring substrate is separated from the mask are adhered onto the adhering head of the surplus ball removing apparatus and are removed.

In the present invention, the surplus balls are adhered onto the adhering head and are removed. As a result, the surplus balls can be removed by the automation in a short time, and a production efficiency can be improved remarkably in contrast to the method of removing the surplus balls by human work. Also, the surplus balls are removed by the adhering head in a pinpoint fashion. Therefore, no damage is applied to the normal conductive balls and the wiring substrate.

In a preferred mode of the present invention, in the step of removing the surplus balls, an adhesive material (a flux, or the like) is transferred to a top end portion of the adhering head, then the surplus balls are removed from the substrate by making the surplus balls adhere onto the adhesive material transferred to the adhering head, and then the surplus balls adhered onto the adhering head are recovered by making the surplus balls adhere onto an adhesive sheet.

Also, in a preferred mode of the present invention, in the step of removing the surplus balls, arrangement coordinates of the surplus balls on the substrate are specified by an image recognition, then the adhering head is moved at the arrangement coordinates, and then the surplus balls are removed from the substrate.

In this mode, the surplus balls are detected as a foreign matter by using the image recognition, and the arrangement coordinates are specified with good precision. Therefore, there is no fear that the removing residue of the surplus balls occurs, and the surplus balls can be removed from the wiring substrate with good reliability.

As explained above, according to the present invention, the surplus balls mounted on the substrate can be removed effectively, and also one conductive ball can be mounted on each connection pad with good reliability.

DETAILED DESCRIPTION OF THE PREFERRED EMBODIMENT

An embodiment of the present invention will be explained with reference to the accompanying drawings hereinafter.

Figure 8:
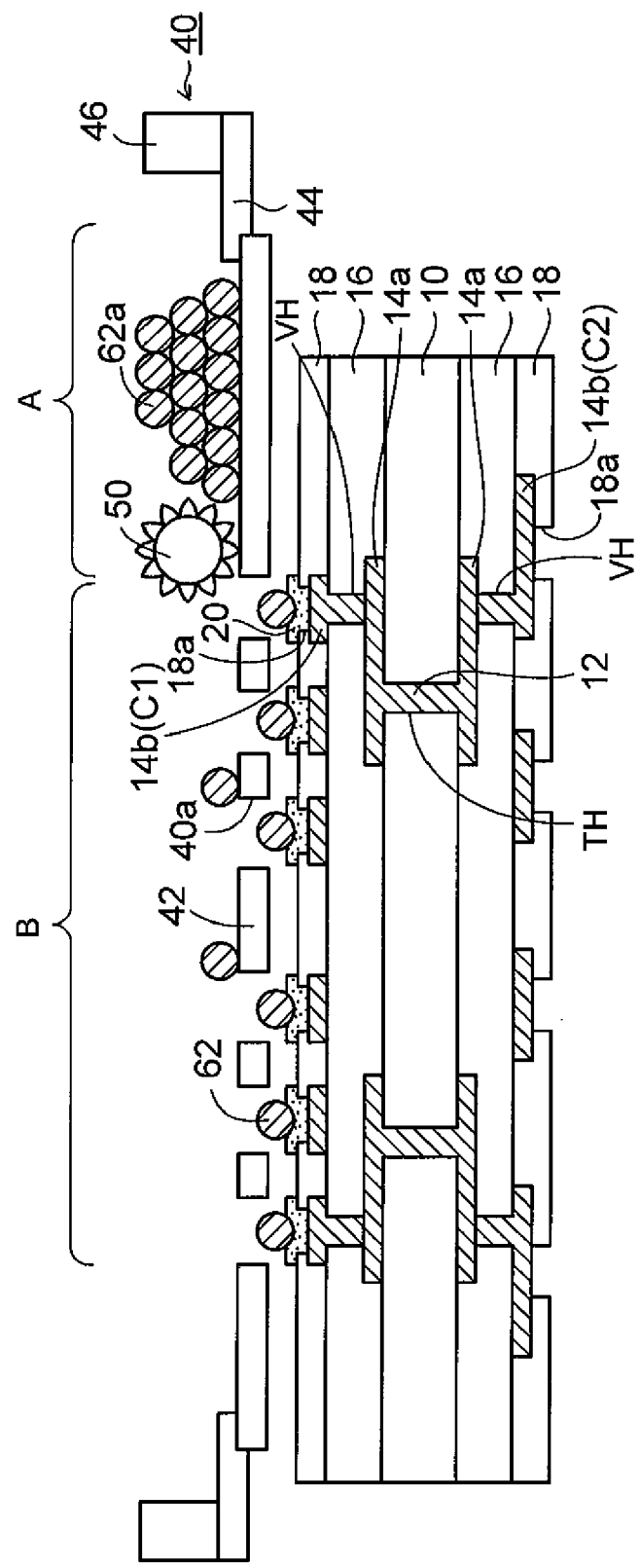
FIG. 8 is a sectional view (#4) showing the conductive ball mounting method according to the embodiment of the present invention.
Figure 9:
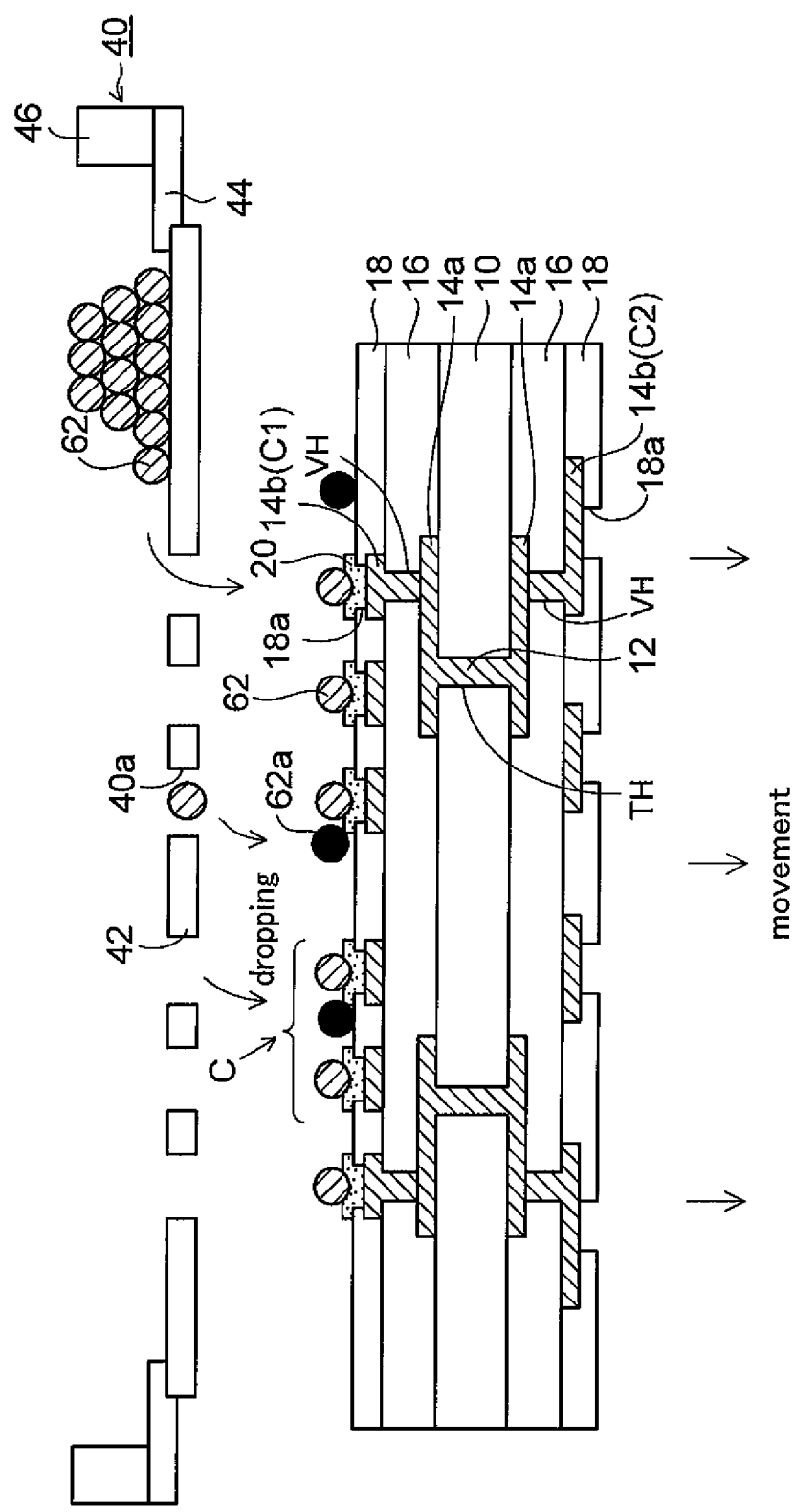
FIG. 9 is a sectional view (#5) showing the conductive ball mounting method according to the embodiment of the present invention.
Figure 10:
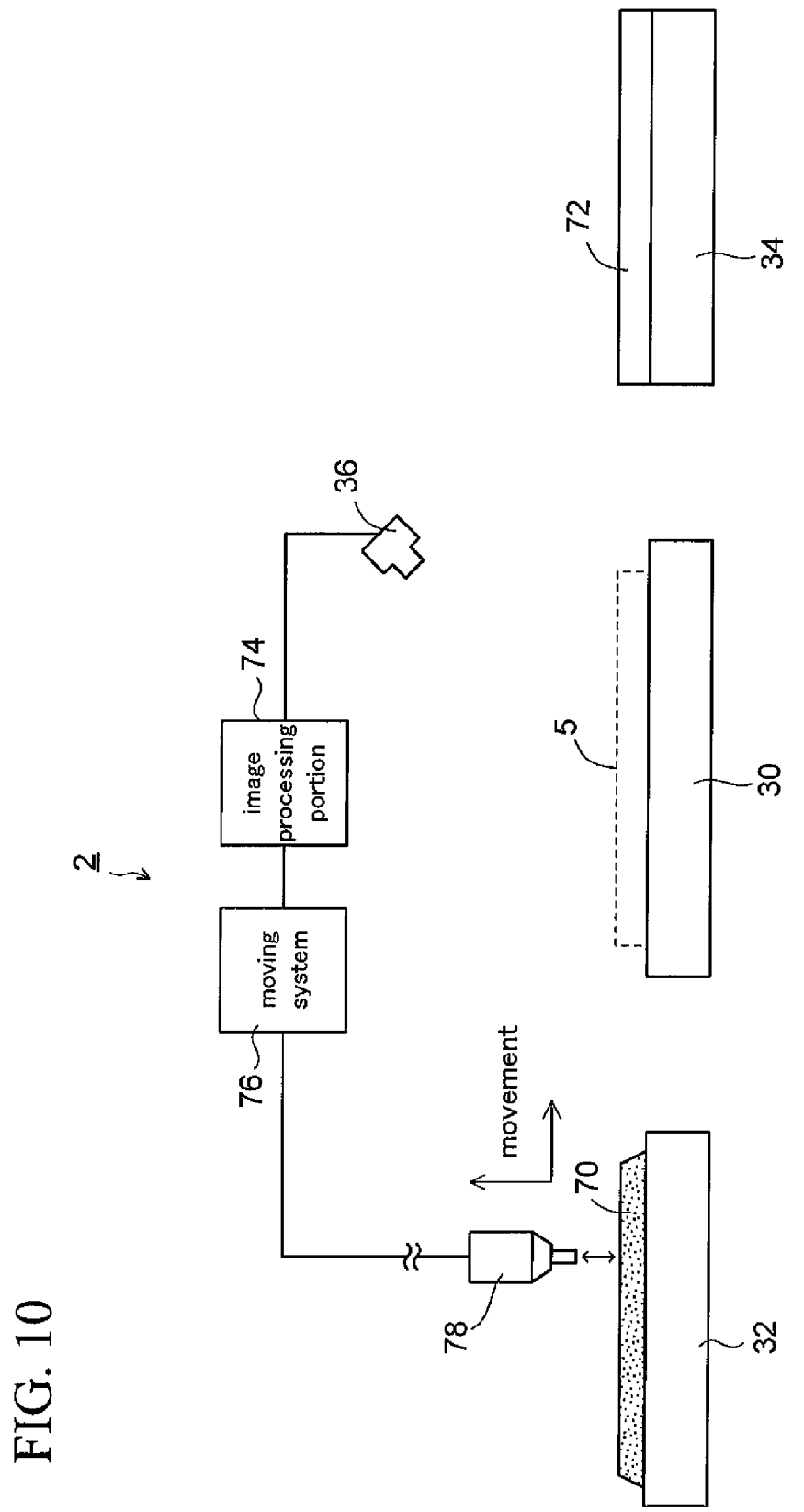
FIG. 10 is a sectional view showing a surplus ball removing apparatus according to the embodiment of the present invention.

FIG. 5 to FIG. 9 are sectional views showing a conductive ball mounting method according to an embodiment of the present invention, FIG. 10 is a sectional view showing similarly a surplus ball removing apparatus, and FIG. 11 to FIG. 14 are sectional views showing similarly a method of removing extra conductive balls from a wiring substrate in the conductive ball mounting method.

Figure 1:
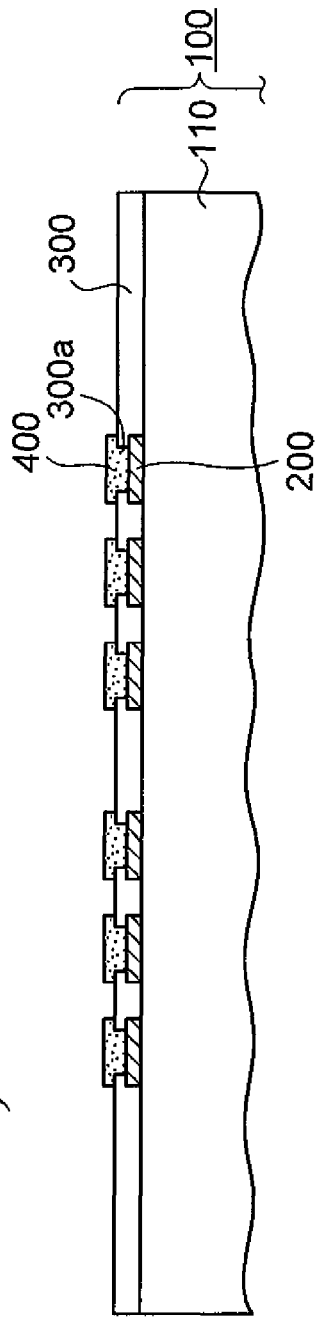
FIG. 1 is a sectional view (#1) showing a conductive ball mounting method in the prior art.
Figure 2:
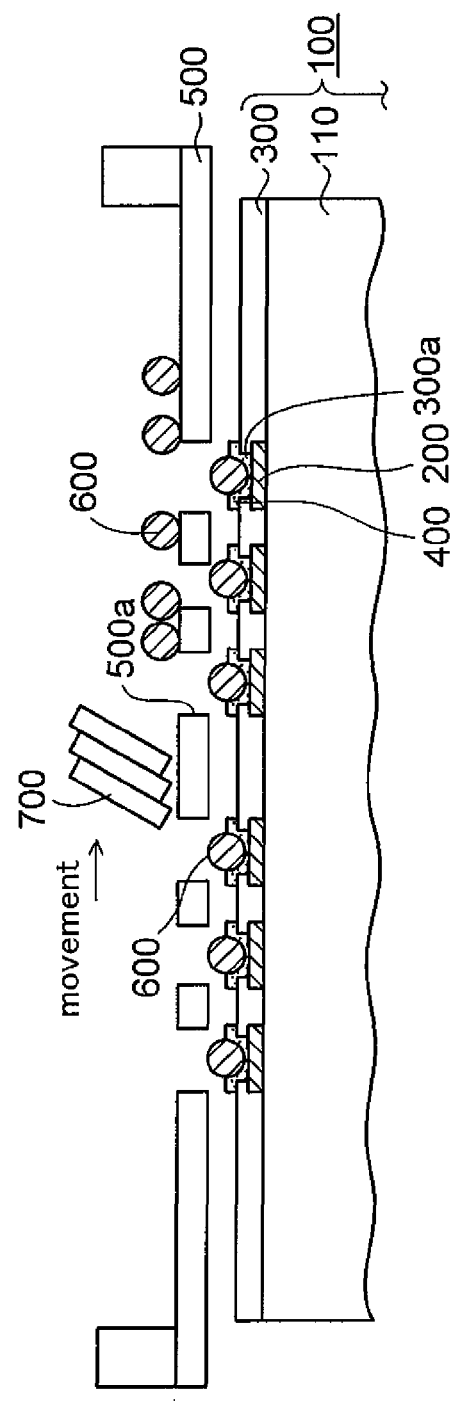
FIG. 2 is a sectional view (#2) showing the conductive ball mounting method in the prior art.
Figure 3:
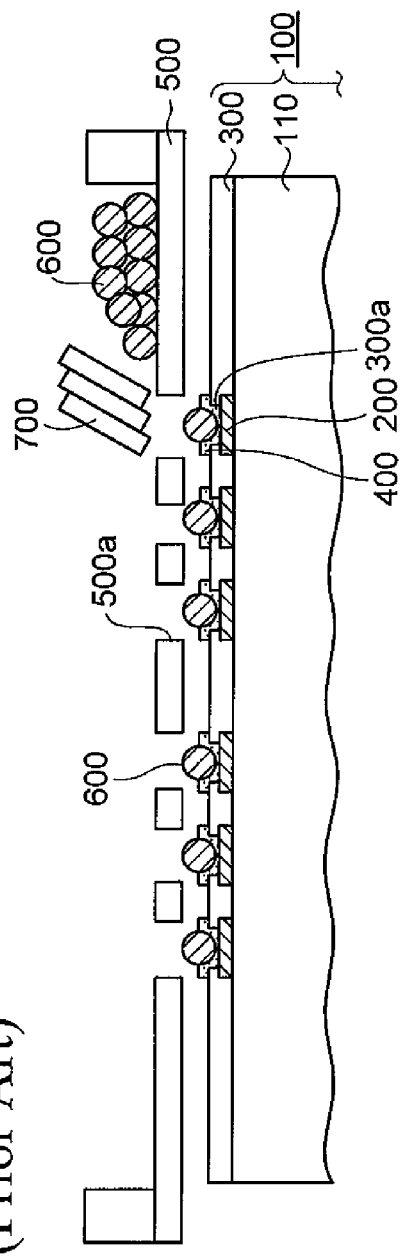
FIG. 3 is a sectional view (#3) showing the conductive ball mounting method in the prior art.
Figure 4:
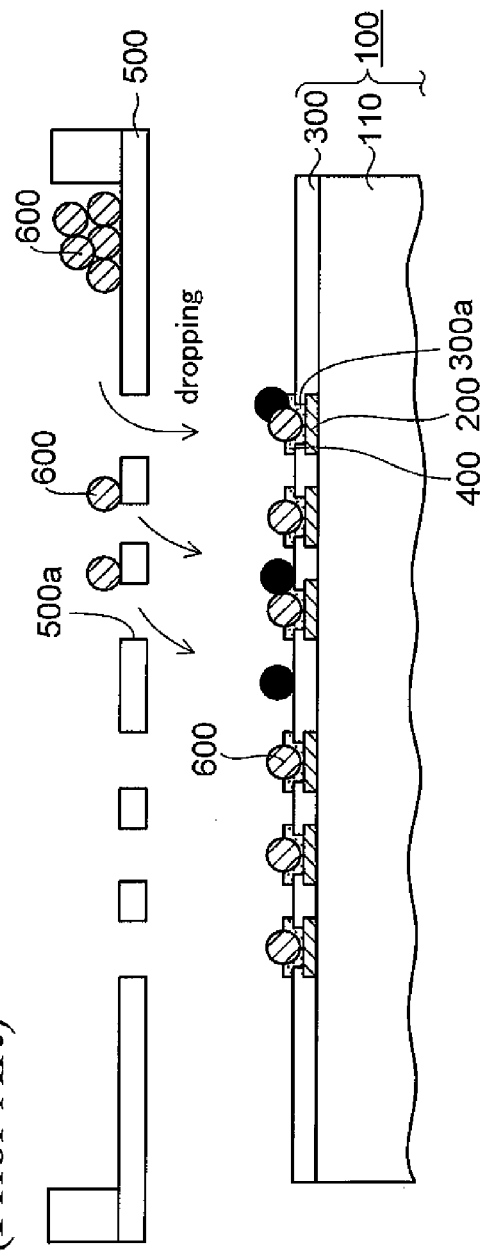
FIG. 4 is a sectional view showing the problem of the conductive ball mounting method in the prior art.
Figure 5:
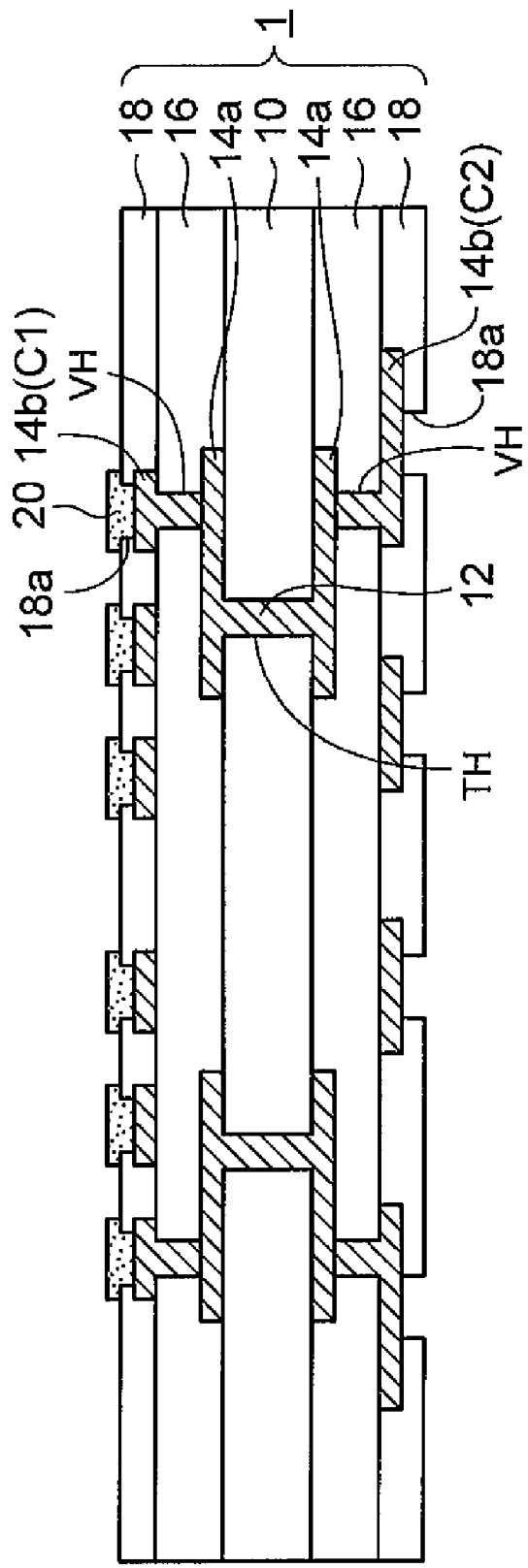
FIG. 5 is a sectional view (#1) showing a conductive ball mounting method according to an embodiment of the present invention.

In the conductive ball mounting method of the present embodiment, as shown in FIG. 5, first, a wiring substrate 1 on which conductive balls are to be mounted is prepared. In the wiring substrate 1, through holes TH are provided in a core substrate 10 which is formed of a glass epoxy resin, or the like, and a through hole 12 made of copper, or the like is filled in the through holes TH respectively. Also, first wiring layers 14a connected mutually via the through holes 12 and made of copper, or the like are formed on both surface sides of the core substrate 10 respectively.

Alternately, the first wiring layers 14a formed on both surface sides of the core substrate 10 may be connected mutually via through hole plating layers formed on inner walls of the through holes TH, and a resin may be filled in the remained hole in the through holes TH.

An interlayer insulating layer 16 which covers the first wiring layers 14a is formed on both surface sides of the core substrate 10 respectively. The interlayer insulating layer 16 is formed by pasting a resin film made of epoxy, polyimide, or the like on the core substrate 10, for example.

Via holes VH each having a depth that reaches the first wiring layer 14a are formed in the interlayer insulating layer 16 on both surface sides of the core substrate 10 respectively. Also, second wiring layers 14b connected to the first wiring layer 14a via the via holes VH (via conductors in it) are formed on the interlayer insulating layer 16 on both surface sides of the core substrate 10 respectively. In FIG. 5, connection pads C1, C2 are illustrated as the second wiring layers 14b.

A solder resist 18 in which opening portions 18a are provided on the connection pads C1, C2 is formed on the second wiring layers 14b on both surface sides of the core substrate 10 respectively. Also, a flux 20 is formed on the connection pads C1 of the second wiring layers 14b on the upper surface side of the core substrate 10 respectively. The flux 20 is coated on the connection pads C1 of the second wiring layers 14b with patterns by the printing, the dispenser, or the like. Otherwise, the flux may be formed as a whole on the upper surface side of the wiring substrate 1.

In this case, the rigid substrate is illustrated as the wiring substrate 1. But a flexible wiring substrate using a film as the substrate may be employed. Also, as the substrate (work) equipped with the connection pads on which the conductive balls are to be mounted, a semiconductor wafer (silicon wafer) in which a semiconductor element (a transistor, or the like) and a multiplayer wiring layer connected to this element are formed and the connection pads are provided on the uppermost layer may be employed instead of the wiring substrate 1. Such semiconductor wafer is diced into individual semiconductor chip such as CPU, memory, or the like after the conductive balls are mounted on the connection pads.

Figure 6:
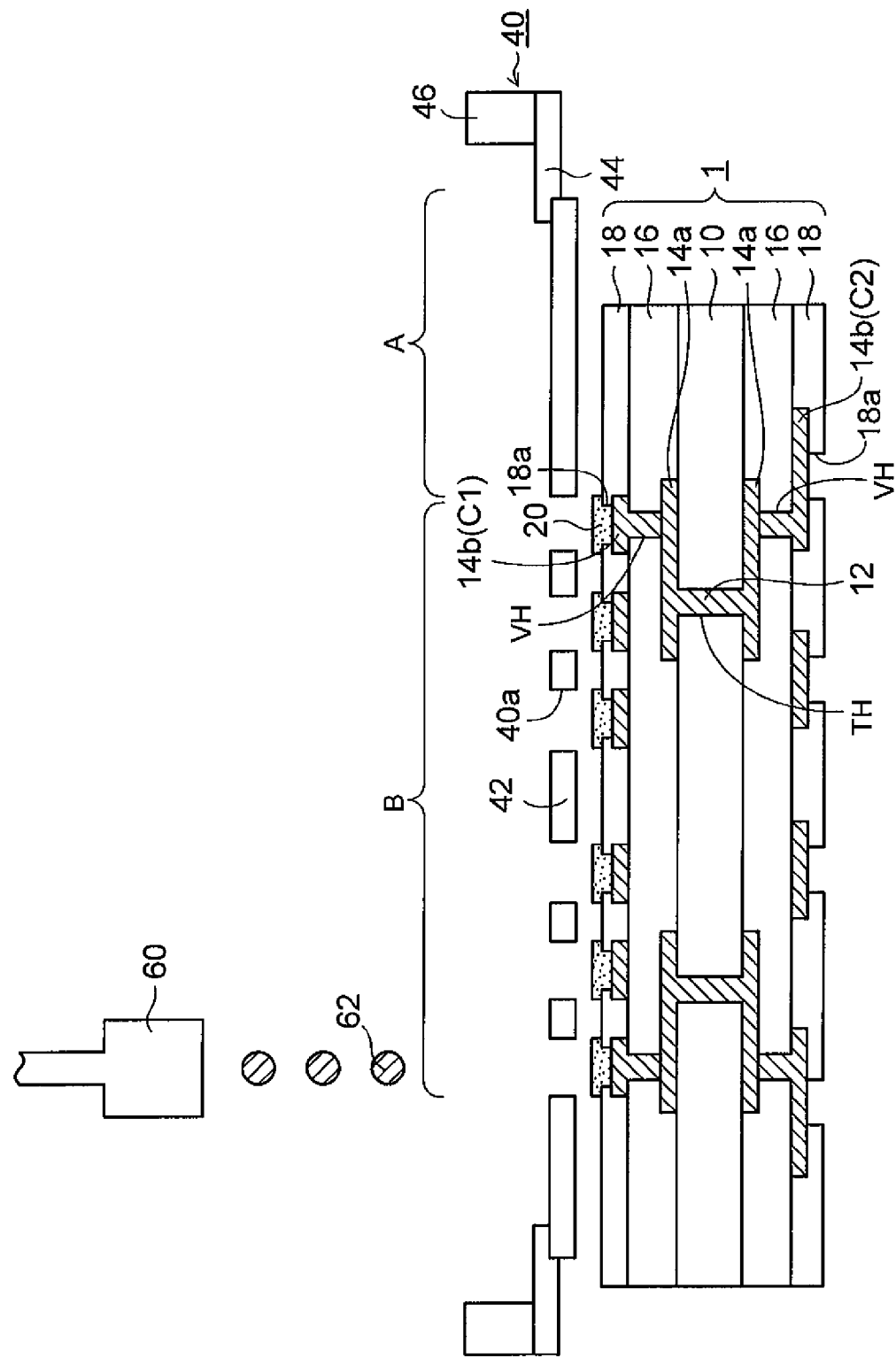
FIG. 6 is a sectional view (#2) showing the conductive ball mounting method according to the embodiment of the present invention.

Then, as shown in FIG. 6, the wiring substrate 1 in FIG. 5 is placed on a stage of a ball mounting apparatus (not shown) and fixed thereto. Also, a mask 40 having opening portions 40a corresponding to the connection pads C1 of the wiring substrate 1 is arranged on the wiring substrate 1. The mask 40 is composed of a metal mask portion 42 in which the opening portions 40a are provided, a mesh portion 44 provided on the peripheral side and made of a resin, or the like, and a frame portion 46 provided around the mesh portion 44. In the mask 40, a product area B in which a plurality of opening portions 40a are arranged, and a ball recovering area A arranged on one end side of the product area B are defined.

At this time, an image recognition camera (not shown) recognizes alignment marks of the wiring substrate 1, and the mask 40 is arranged to be aligned with the wiring substrate 1 such that the opening portions 40a of the mask 40 correspond to the connection pads C1 of the wiring substrate 1.

Then, as also shown in FIG. 6, conductive balls 62 are supplied onto the mask 40 from a ball supplying system 60. The conductive balls 62 are supplied in considerably larger number than the number the opening portions 40a (corresponding to the connection pads C1 of the wiring substrate 1) of the mask 40.

In the present embodiment, such a mode is illustrated that the semiconductor chip is flip-chip connected to the connection pads C1 of the wiring substrate 1. In such case, the ball at least an outer surface portion of which is formed of solder is employed as the conductive ball 62. For example, there are the solder ball formed of solder over the whole, the ball in which an outer surface of a core ball made of resin is coated with a solder layer, or the ball in which an outer surface of a core ball made of copper is coated with a solder layer, and the like. The conductive balls made of various conductive materials may be employed according to the application of the substrate (work) on which the conductive balls are to be mounted.

Also, in the present embodiment, a diameter of the conductive ball 62 is set to 10 to 110 μm, and the conductive ball 62 whose diameter is relatively small, and in which it is difficult to mount by a method of mounting collectively the conductive balls by an absorbing tool, or the like, is employed. For example, when a diameter of the conductive ball 62 is set to 100 μm, a pitch between the connection pads C1 of the wiring substrate is 200 μm (line:space=100 μm:100 μm).

Figure 7:
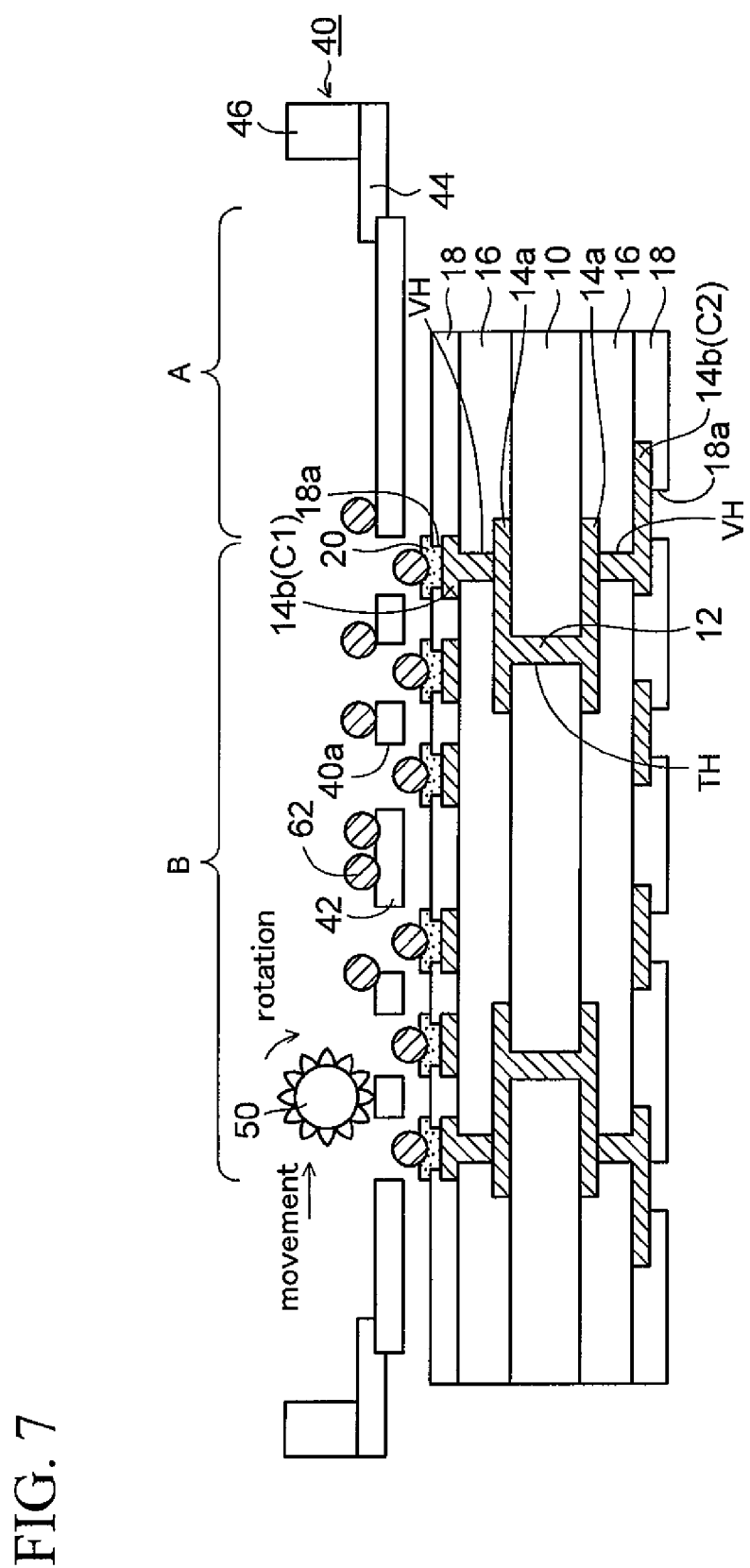
FIG. 7 is a sectional view (#3) showing the conductive ball mounting method according to the embodiment of the present invention.

Then, as shown in FIG. 7 and FIG. 8, a rotary brush 50 (ball moving means) with a rod shape is moved from the product area B to the ball recovering area A of the mask 40 while being rotated, and thus a large number of conductive balls 62 on the mask 40 are moved into the ball recovering area A of the mask 40. Accordingly, the conductive balls 62 on the mask 40 are passed through the opening portions 40a of the mask 40 respectively, and also remaining conductive balls 62 are excluded into the ball recovering area A on one end side of the mask 40. In this fashion, the conductive ball 62 is arranged on the fluxes 20 on the connection pads C1 of the wiring substrate 1 through the opening portions 40a of the mask 40 respectively.

At this time, as shown in FIG. 8, such situation appears that the extra conductive balls 62 which have not been swept away by the movement of the rotary brush 50 still remain somewhat in the product area B on the mask 40.

Then, as shown in FIG. 9, the wiring substrate 1 is moved downward and is separated from the mask 40.

At this time, since the mask 40 is jolted, the extra conductive balls 62 which are left in the product area B on the mask 40 pass through the opening portions 40a of the mask 40 respectively and then drop onto the wiring substrate 1. As a result, surplus balls 62a (indicated with a black mark) are mounted on the wiring substrate 1. Also, sometimes the extra conductive balls 62 which are swept out in the ball recovering area A of the mask 40 roll along in the opening portion 40a side of the mask 40 and then drop onto the wiring substrate 1.

In this manner, the surplus balls 62a are put on the neighborhood of the normal conductive balls which are arranged on the connection pads C1 of the wiring substrate 1 at a time when the wiring substrate 1 is separated from the mask 40.

Next, a surplus ball removing apparatus for removing the surplus balls 62a which are to be mounted on the wiring substrate 1 will be explained hereunder. As shown in FIG. 10, a surplus ball removing apparatus 2 of the present embodiment includes a substrate stage 30 on which a substrate 5 is placed, a flux stage (adhesive material stage) 32 on a surface of which a flux (adhesive material) 70 is provided, and a ball recovering stage 34 on a surface of which an adhesive sheet 72 is provided. The substrate 5 is fixed on the substrate stage 30 by a vacuum chuck system, or the like.

The flux 70 provided on the flux stage 32 is an organic solvent having viscosity, which is sprayed so as to make the soldering easy in manufacturing the wiring substrate or mounting the semiconductor chip, or the like. As this flux, a flux whose tackiness (adhesive property) is higher than the above flux 20 provided on the connection pads C1 of the wiring substrate 1 is employed.

Also, the surplus ball removing apparatus 2 includes an adhering head 78. The adhesive portion is provided by transferring the flux 70 on the flux stage 32 onto a top end portion of the adhering head 78.

Further, the surplus ball removing apparatus 2 includes an image recognition camera (CCD camera) 36, an image processing portion 74 connected to the image recognition camera 36, and a moving system 76 connected to the image processing portion 74. The moving system 76 is connected to the adhering head 78, and can make the adhering head 78 move in the horizontal direction or the vertical direction with good precision.

The image recognition camera 36 shoots a surface of the substrate 5 on which the surplus balls are mounted, and image data are transmitted to the image processing portion 74. The image processing portion 74 processes the image data to detect the surplus ball as a foreign matter, and transmits arrangement coordinate data by which the surplus ball is arranged on the substrate 5 to the moving system 76. The moving system 76 moves the adhering head 78 based on the arrangement coordinate data.

The surplus ball removing apparatus 2 of the present embodiment is basically constructed in this manner. The surplus balls on the substrate 5 are picked up by the birdlime system, and then the surplus balls adhered on the adhering head 78 are transferred onto the adhesive sheet 72 on the ball recovering stage 34 and recovered therein.

Next, a method of removing the surplus balls mounted on the wiring substrate 1 in FIG. 9 by using the surplus ball removing apparatus 2 of the present embodiment will be explained hereunder.

Figure 11A:
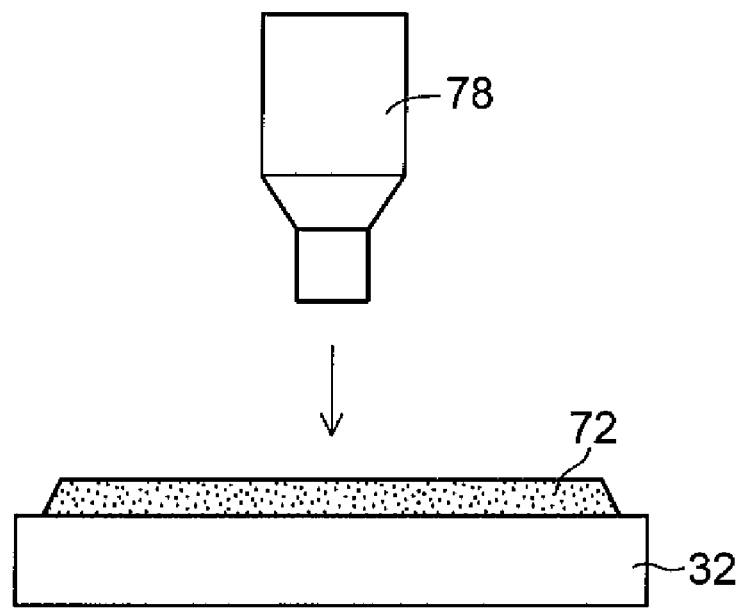
FIGS. 11A and 11B are sectional views (#1) showing a method of removing extra conductive balls from a wiring substrate in the conductive ball mounting method according to the embodiment of the present invention.
Figure 11B:
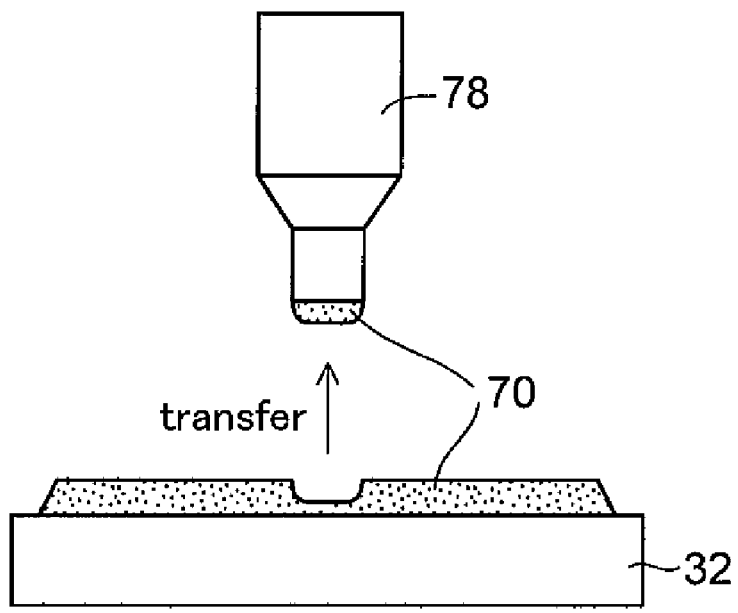

As shown in FIGS. 11A and 11B, first, the top end portion of the adhering head 78 of the surplus ball removing apparatus 2 mentioned above is pushed against the flux 70 on the flux stage 32. Thus, the flux 70 is transferred onto the top end portion of the adhering head 78 to give the tackiness.

In this event, the flux 70 is illustrated as the adhesive material provided onto the top end portion of the adhering head 78. But various adhesive materials can be employed. Otherwise, the adhesive material filled in the adhering head 78 may be made to exude to the top end portion. In this case, the flux stage 32 can be omitted.

Figure 12:
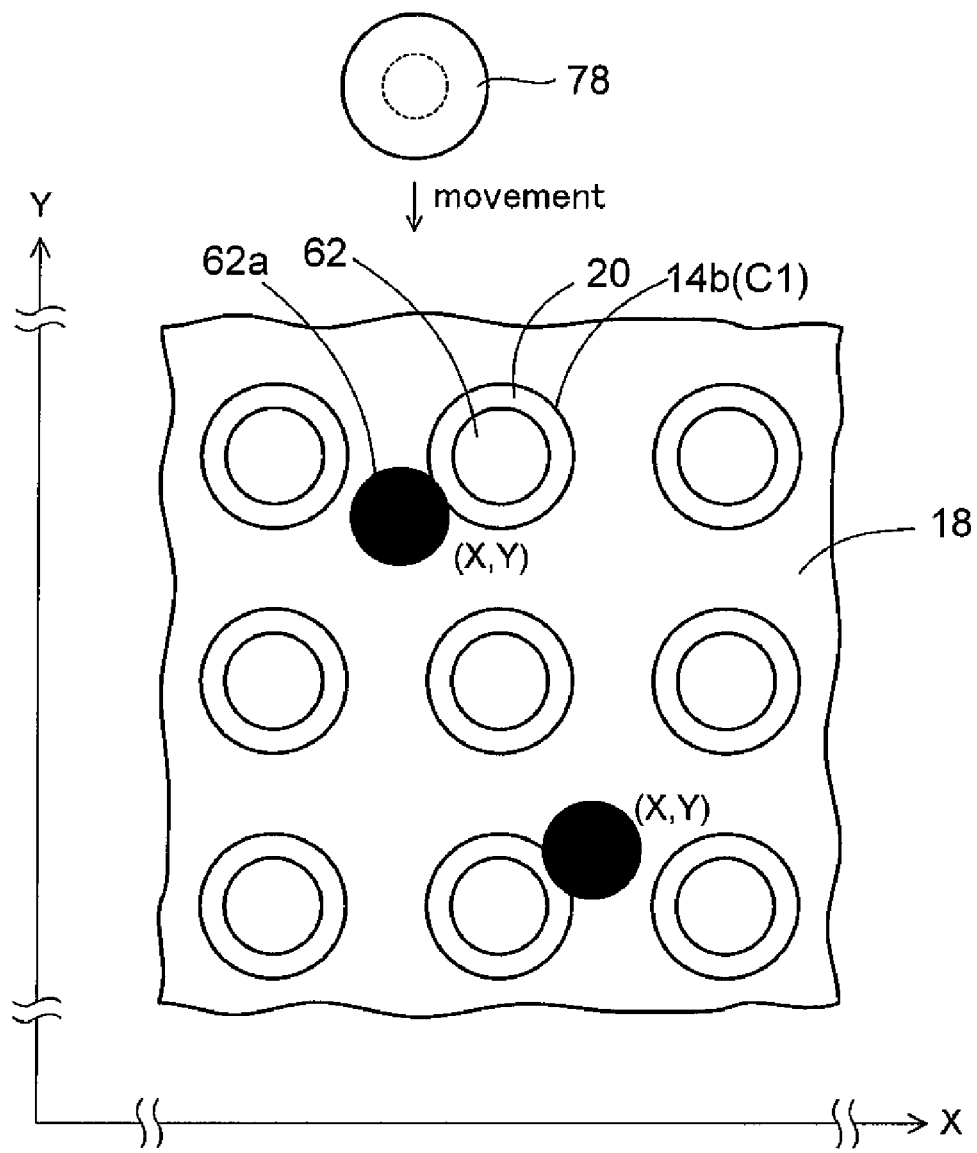
FIG. 12 is a fragmental enlarged plan view (#2) showing the method of removing the extra conductive balls from the wiring substrate in the conductive ball mounting method according to the embodiment of the present invention.

Then, a surface of the wiring substrate 1, on which the surplus balls 62a are mounted in FIG. 9, is shot by the image recognition camera 36, and then the image data is transmitted to the image processing portion 74. FIG. 12 is a fragmental enlarged plan view when a C portion of the wiring substrate 1 in FIG. 9 is viewed from the top. The surplus ball 62a (indicated with the black mark) is arranged between the normal conductive balls 62 mounted on the connection pads C1 which are arranged as the area array type. As shown in FIG. 12, the image processing portion 74 of the surplus ball removing apparatus 2 in FIG. 10 processes the image data of the wiring substrate 1, then recognizes the surplus ball 62a arranged between the normal conductive balls 62 as a foreign matter, and then specifies arrangement coordinates (X,Y) where the surplus balls are arranged.

Then, in the surplus ball removing apparatus 2 in FIG. 10, the data of the arrangement coordinates (X,Y) of the surplus balls 62a are transmitted to the moving system 76. Accordingly, the adhering head 78 placed over the flux stage 32 is moved in the horizontal direction by the moving system 76, and is arranged over the substrate stage 30. Then, the position of the adhering head 78 is adjusted at the arrangement coordinates (X,Y) where the surplus balls 62a exist with good precision, and the adhering head 78 is positioned there.

Figure 13A:
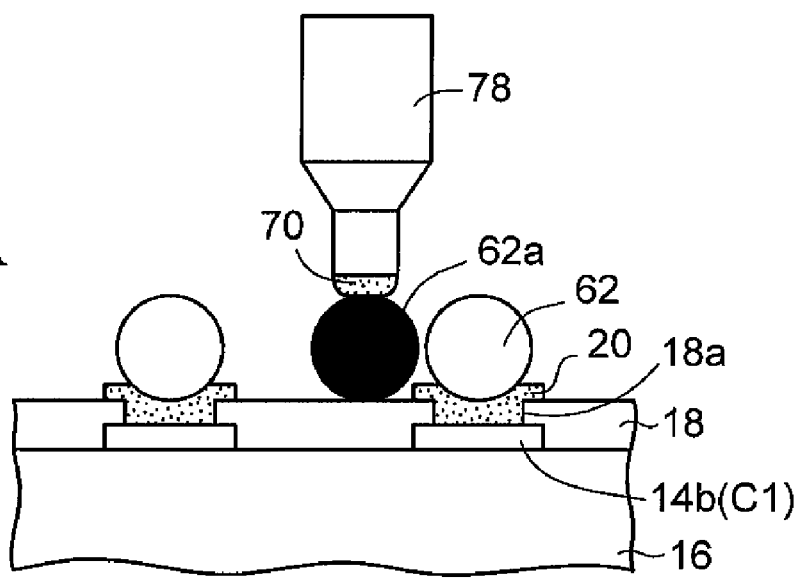
FIGS. 13A and 13B are sectional views (#3) showing the method of removing the extra conductive balls from the wiring substrate in the conductive ball mounting method according to the embodiment of the present invention.
Figure 13B:
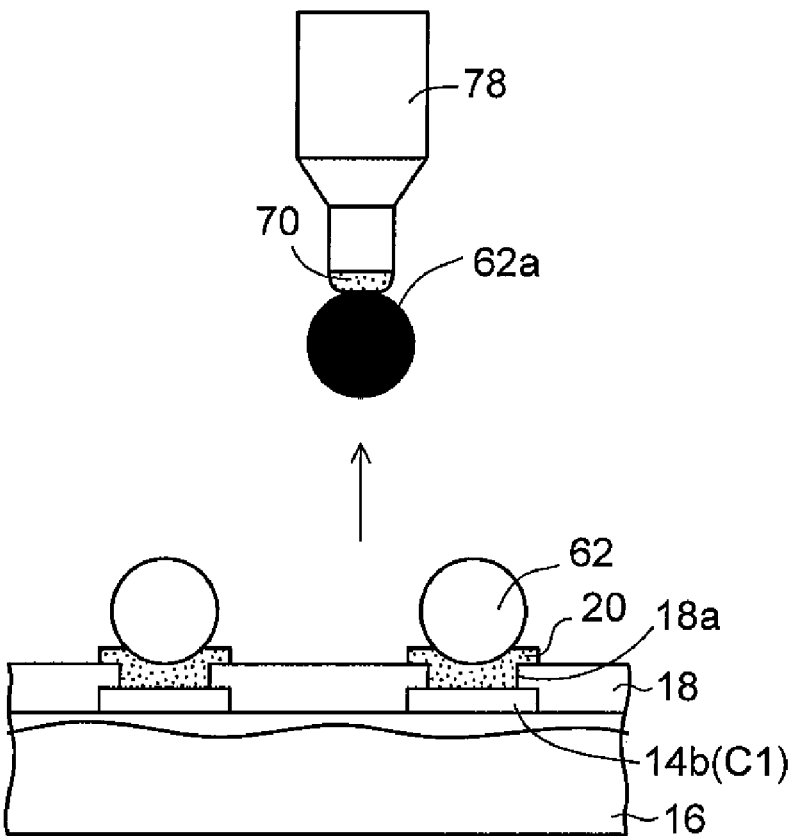

Following steps will be explained with reference to the fragmental enlarged sectional views in which the C portion in FIG. 9 is enlarged (FIG. 13 and FIG. 14). As shown in FIG. 13A, the adhering head 78 located at the arrangement coordinates (X,Y) of the surplus balls 62a moves downward, and makes the surplus ball 62a adhere onto the flux 70 of the top end portion thereof. Then, as shown in FIG. 13B, the adhering head 78 onto which the surplus ball 62a is adhered moves upward, then moves in the horizontal direction, and then is arranged over the ball recovering stage 34 (see FIG. 10).

Here, in FIGS. 13A and 13B, the surplus balls 62a are arranged on the solder resist 18. When the flux 20 is provided on the whole upper surface of the wiring substrate 1 in FIG. 5, the surplus balls 62a are arranged on the flux 20. In this case, as described above, the flux whose tackiness (adhesive property) is higher than the above flux 20 coated on the wiring substrate 1 is employed as the flux 70 which is adhered onto the adhering head 78 of the surplus ball removing apparatus 2. Therefore, the surplus balls 62a can be removed easily from the wiring substrate 1.

Figure 14A:
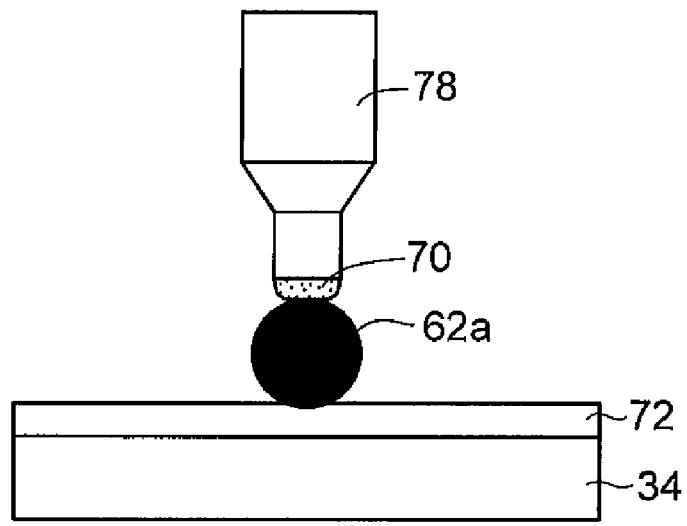
FIGS. 14A and 14B are sectional views (#4) showing the method of removing the extra conductive balls from the wiring substrate in the conductive ball mounting method according to the embodiment of the present invention.
Figure 14B:
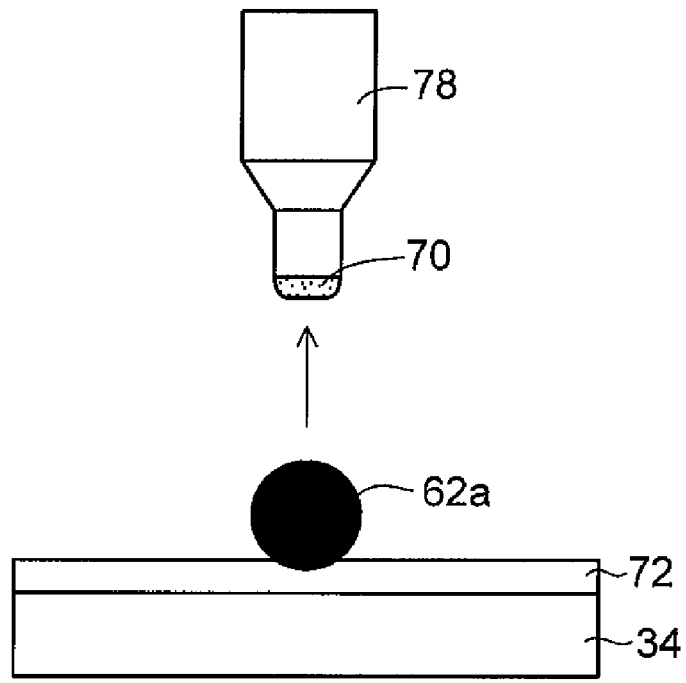

Then, as shown in FIG. 14A, the surplus balls 62a adhered onto the adhering head 78 are pushed against the adhesive sheet 72 on the ball recovering stage 34. Also, as shown in FIG. 14B, the surplus balls 62a are adhered and transferred onto the adhesive sheet 72 by moving upward the adhering head 78.

A bonding strength between the adhesive sheet 72 and the surplus balls 62a is set stronger than a bonding strength between the flux 70 of the adhering head 78 and the surplus balls 62a. Therefore, the surplus balls 62a are transferred easily from the adhering head 78 side to the adhesive sheet 72 side. In this manner, the surplus balls 62a on the wiring substrate 1 are recovered on the adhesive sheet 72 on the ball recovering stage 34.

The data of the arrangement coordinates (X,Y) of a plurality of surplus balls 62a on the wiring substrate 1 are specified collectively by the image recognition camera 36 and the image processing portion 74. And the adhering head 78 repeats a series of above operations, thus a plurality of surplus balls 62a are removed one by one from the wiring substrate 1.

Figure 15:
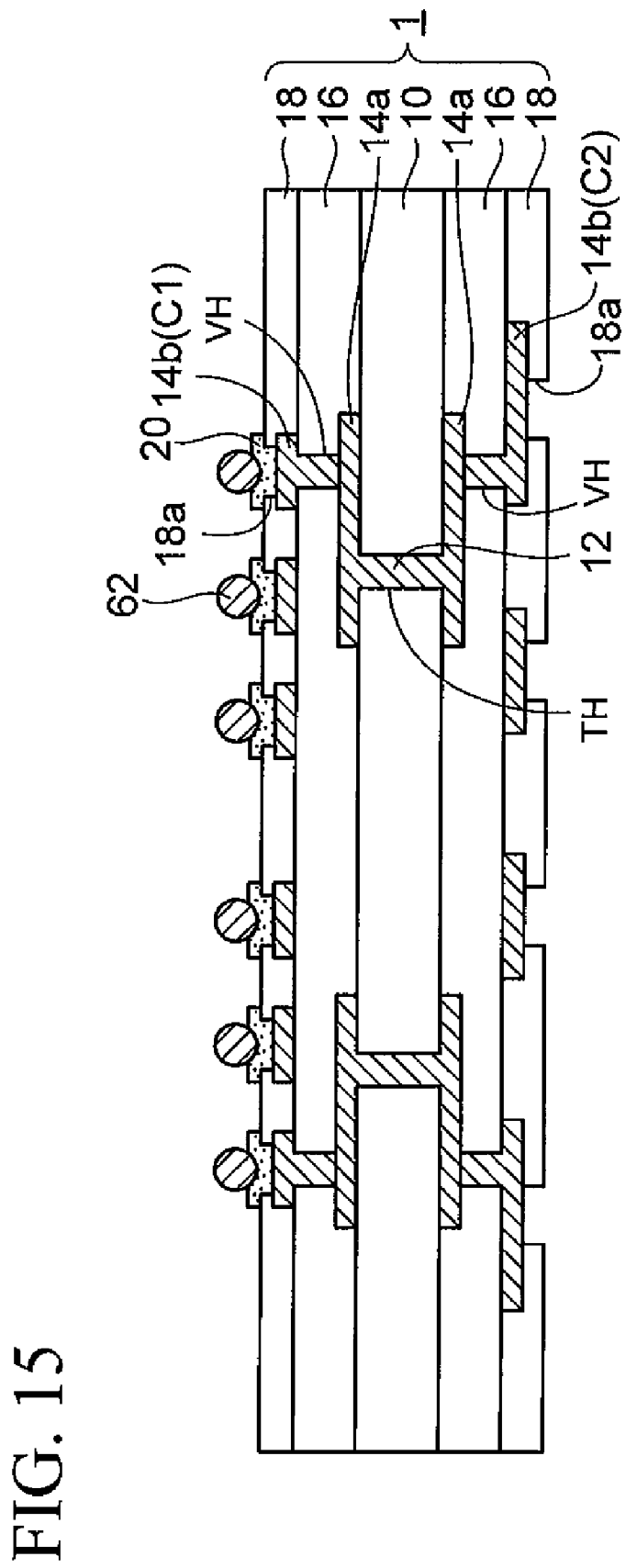
FIG. 15 is a sectional view showing the wiring substrate from which the surplus balls are removed in the conductive ball mounting method according to the embodiment of the present invention.

As a consequence, as shown in FIG. 15, the surplus balls 62a are removed completely from the wiring substrate 1, and thus the wiring substrate 1 in which the conductive balls 62 are mounted on the connection pads C1 on a one-to-one basis respectively is obtained.

In this event, the conductive balls can also be mounted on the connection pads of the above semiconductor wafer except the wiring substrate 1 with good reliability by the similar method.

As explained above, in the conductive ball mounting method of the present embodiment, the normal conductive balls 62 are arranged on the connection pads C1 of the wiring substrate through the opening portions 40a of the mask 40, and the surplus balls 62a which are dropped on the wiring substrate 1 when the wiring substrate 1 is separated from the mask 40 are adhered onto the adhering head 78 of the surplus ball removing apparatus 2 and removed.

With employment of such method, the step of removing the surplus balls 62a can be carried out by the automation in a short time. Therefore, a production efficiency can be improved remarkably in contrast to the method of removing the surplus balls 62a by human work. Also, the flux 70 is used as the adhesive material. Therefore, even when the flux 70 is adhered on the wiring substrate 1, no bad influence upon the wiring substrate 1 is caused.

Also, the surplus balls 62a are adhered onto the adhering head 78 and are removed in a pinpoint fashion. Therefore, no damage is applied to the normal conductive balls 62 and the wiring substrate 1. In addition, the surplus balls 62a are specified by the image recognition. Therefore, there is no fear that the removing residue of the surplus balls 62a occurs, and as a result a yield of the wiring substrate 1 can be improved.

Figure 16:
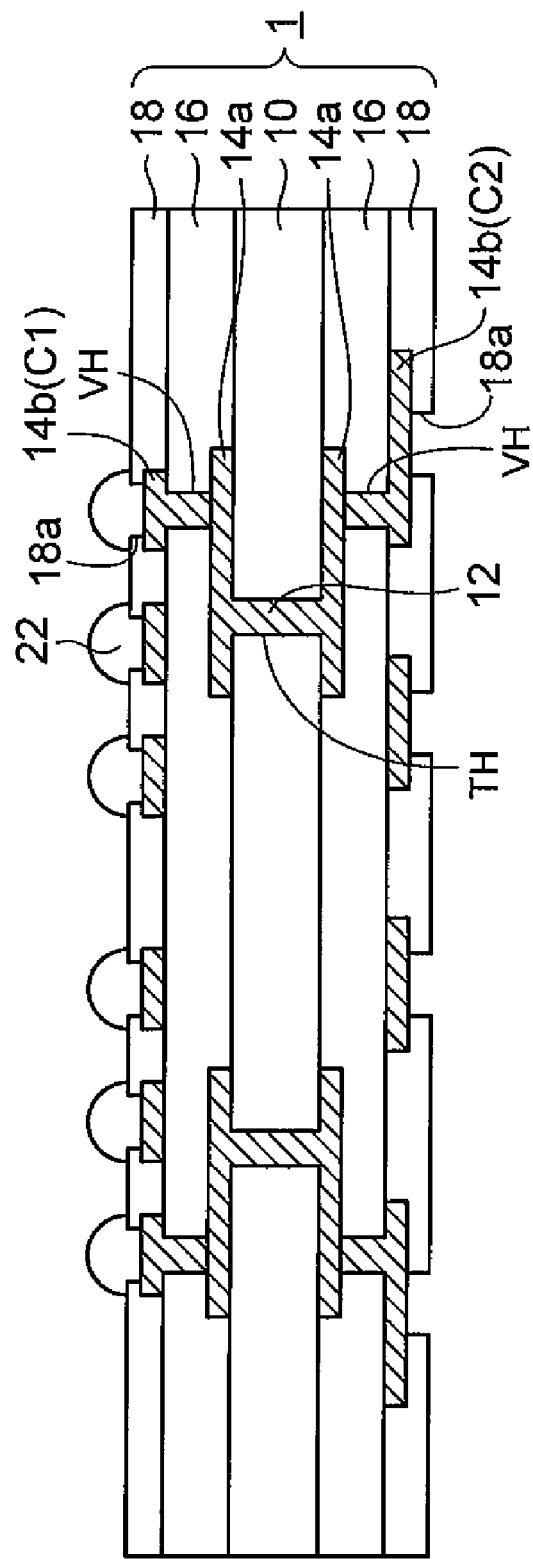
FIG. 16 is a sectional view (#1) showing a method of mounting a semiconductor chip on a wiring substrate on which the conductive balls are mounted.

Next, a method of mounting a semiconductor chip on the wiring substrate 1 on which the conductive balls 62 are mounted will be explained hereunder. As shown in FIG. 16, the reflow heating is applied to the conductive balls (solder balls) mounted on the wiring substrate 1, and then solder bumps 22 are obtained by removing the flux residue. In the present embodiment, as described above, such a disadvantage can be solved that plural conductive balls are mounted on one connection pad C1 on the wiring substrate 1. Therefore, the solder bumps 22 whose heights can be set uniform within the specification over the whole area can be obtained.

Figure 17:
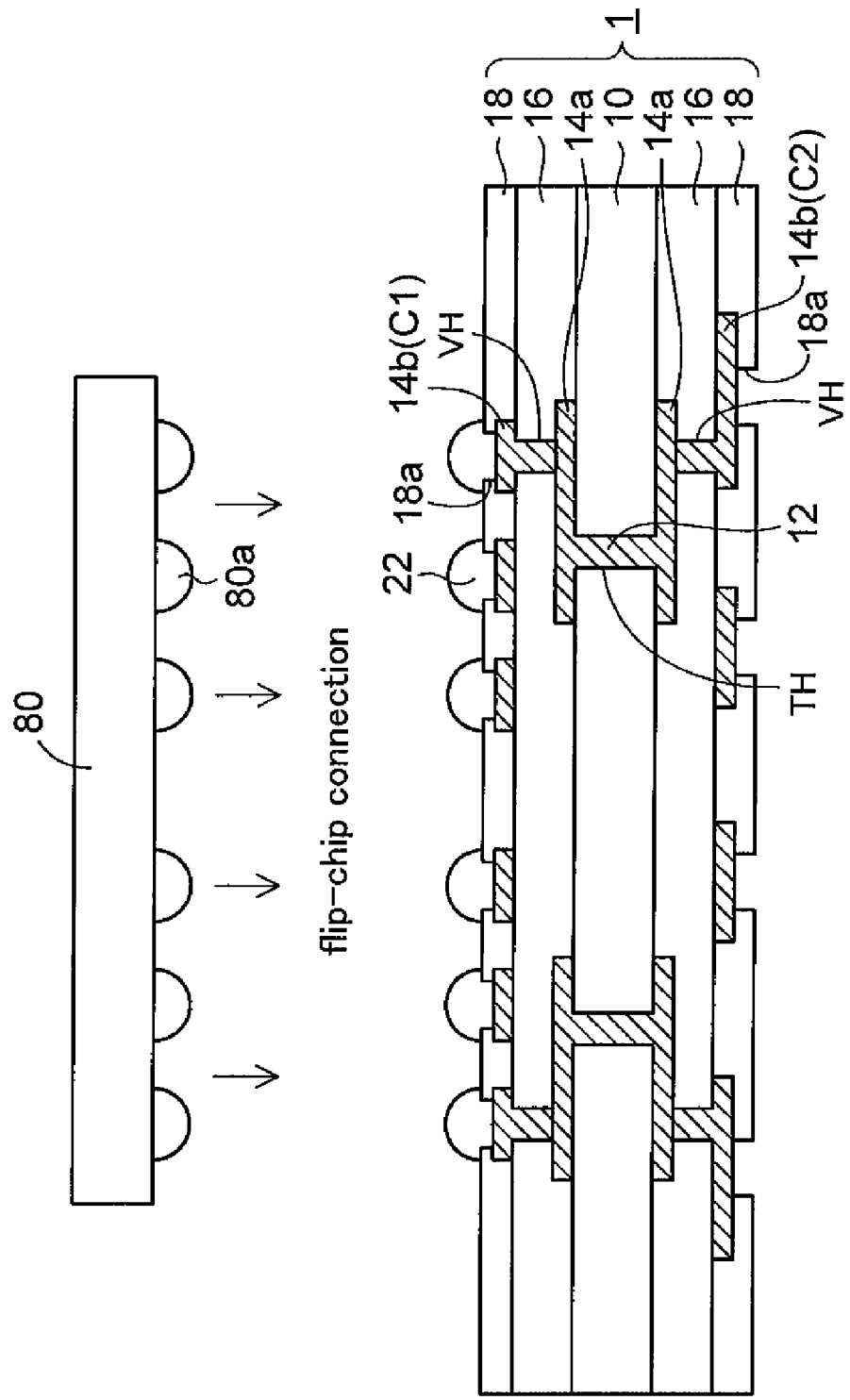
FIG. 17 is a sectional view (#2) showing the method of mounting a semiconductor chip on a wiring substrate on which the conductive balls are mounted.

Also, as shown in FIG. 17, a semiconductor chip 80 having solder bumps 80a thereon is prepared. Then, the solder bumps 80a of the semiconductor chip 80 are arranged on the solder bumps 22 of the wiring substrate 1, and are flip-chip connected to the solder bumps 22 by applying the reflow heating.

Figure 18:
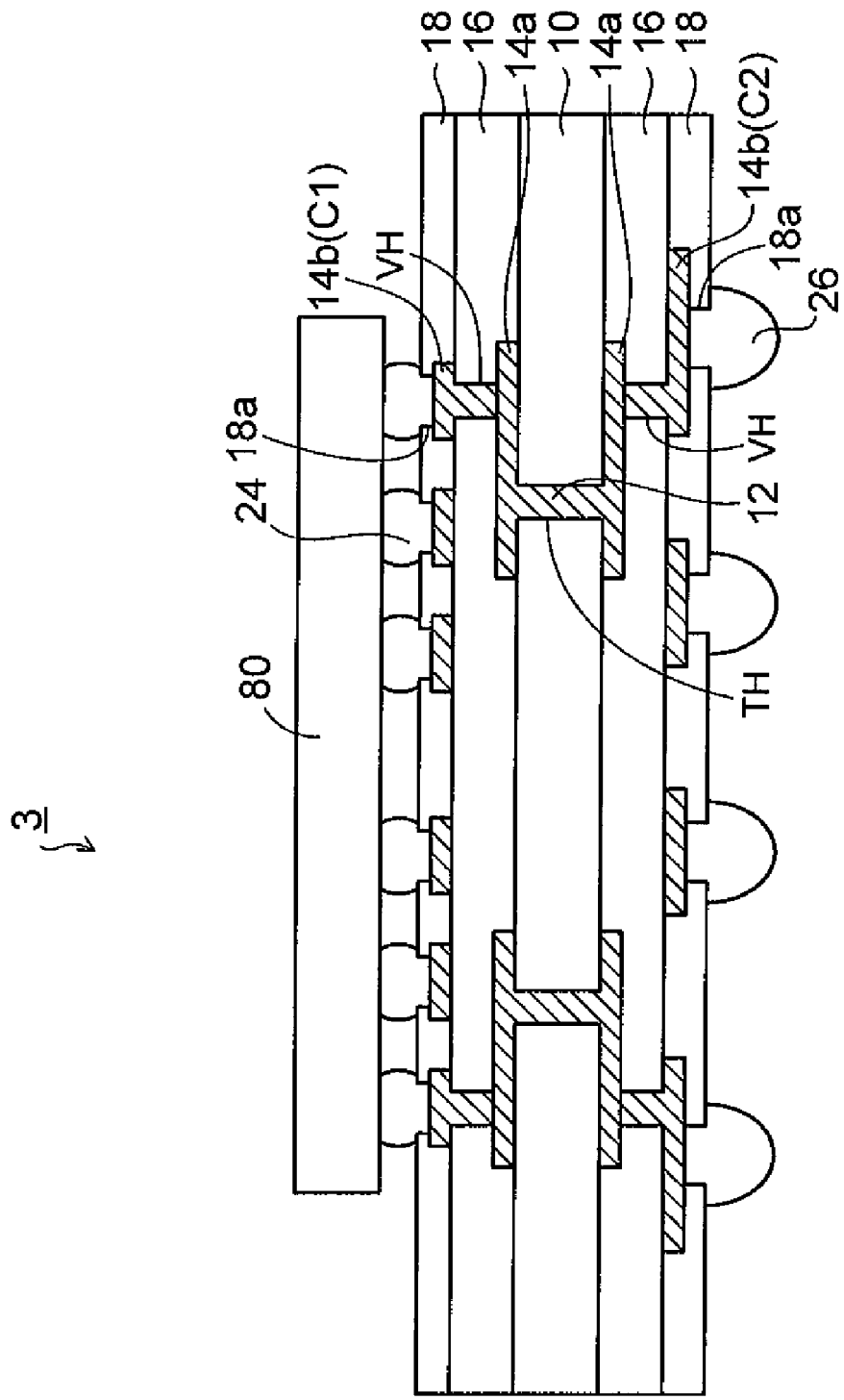
FIG. 18 is a sectional view (#3) showing the method of mounting a semiconductor chip on a wiring substrate on which the conductive balls are mounted.

Accordingly, as shown in FIG. 18, the solder bumps 22 of the wiring substrate 1 and the solder bumps 80a of the semiconductor chip 80 are fused together, and thus bump electrodes 24 are formed. Therefore, the semiconductor chip 80 is connected electrically to the connection pads C of the wiring substrate 1. Also, in addition to the solder, various metals can be employed as respective bumps of the wiring substrate 1 and the semiconductor chip 80. Also, external connection terminals 26 are provided by mounting the solder ball on the connection pads C2 on the lower surface side of the wiring substrate 1 respectively, or the like.

Accordingly, a semiconductor device 3 of the present embodiment is obtained. In this case, when a large-sized substrate for multiple production is employed as the wiring substrate 1, the wiring substrate 1 is cut and divided before or after the semiconductor chip 80 is mounted.

What is claimed is:

1. A surplus ball removing apparatus,
   which is used in a method of arranging a conductive ball on a connection pad of a substrate through an opening portion of a mask,
   and is used for removing the surplus ball mounted on the substrate, by that an extra conductive ball on the mask drops through the opening portion of the mask when the mask and the substrate are separated, comprising:
   an image processing portion detecting a location of the surplus ball on the substrate, and transmitting coordinate data corresponding to the location of the surplus ball on the substrate;
   an adhering head for removing the surplus ball;
   a moving system connected to the adhering head, and making the adhering head move;
   an adhesive material stage on which an adhesive material is provided;
   a substrate stage on which the substrate is placed; and
   a ball recovering stage on which an adhesive sheet is provided;
   wherein a bottom end of the adhering head is configured to receive adhesive material from the adhering stage; the image processing portion transmitting the coordinate data to the moving system, and the moving system moving the adhering head based on the coordinate data; and the adhering head removing the surplus ball which is on the substrate, and transferring said surplus ball onto the ball recovery stage,
   wherein the detecting of the surplus ball by the image processing portion and the removing of the surplus ball by the adhering head are performed after the mask is separated from the substrate.

2. A surplus ball removing apparatus according to claim 1, further comprising:
   an image recognition camera for shooting the substrate;
   wherein the image processing portion is connected to the image recognition camera, for specifying an arrangement coordinate of the surplus ball by processing image data from the image recognition camera; and
   the adhering head is positioned at the arrangement coordinate of the substrate, and the surplus ball is removed by the adhering head.

3. A surplus ball removing apparatus according to claim 1, wherein the adhesive material is a flux.

* * * * *